(12) United States Patent
Zhang et al.

(10) Patent No.: US 9,799,751 B1
(45) Date of Patent: Oct. 24, 2017

(54) METHODS OF FORMING A GATE STRUCTURE ON A VERTICAL TRANSISTOR DEVICE

(71) Applicant: GLOBALFOUNDRIES Inc., Grand Cayman (KY)

(72) Inventors: John H. Zhang, Altamont, NY (US); Steven J. Bentley, Menards, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 32 days.

(21) Appl. No.: 15/132,383

(22) Filed: Apr. 19, 2016

(51) Int. Cl.
| | |
|---|---|
| *H01L 29/66* | (2006.01) |
| *H01L 21/311* | (2006.01) |
| *H01L 21/28* | (2006.01) |
| *H01L 21/321* | (2006.01) |
| *H01L 21/265* | (2006.01) |
| *H01L 21/02* | (2006.01) |
| *H01L 21/8234* | (2006.01) |

(52) U.S. Cl.
CPC .. *H01L 29/66666* (2013.01); *H01L 21/02164* (2013.01); *H01L 21/26513* (2013.01); *H01L 21/28079* (2013.01); *H01L 21/28088* (2013.01); *H01L 21/31111* (2013.01); *H01L 21/32115* (2013.01); *H01L 21/823437* (2013.01); *H01L 21/823487* (2013.01); *H01L 29/6653* (2013.01); *H01L 29/6656* (2013.01); *H01L 29/66545* (2013.01); *H01L 29/66553* (2013.01)

(58) Field of Classification Search
CPC ..... H01L 29/785; H01L 29/517; H01L 21/84; H01L 29/511
See application file for complete search history.

(56) References Cited

U.S. PATENT DOCUMENTS

| | | |
|---|---|---|
| 5,342,797 A | 8/1994 | Sapp et al. |
| 5,414,289 A | 5/1995 | Fitch et al. |
| 6,372,559 B1 | 4/2002 | Crowder et al. |
| 6,686,604 B2 | 2/2004 | Layman et al. |
| 6,690,040 B2 | 2/2004 | Chaudhry et al. |
| 6,759,730 B2 | 7/2004 | Chaudhry et al. |

(Continued)

OTHER PUBLICATIONS

Notice of Allowance from related U.S. Appl. No. 15/097,574 dated Sep. 14, 2016.

(Continued)

*Primary Examiner* — Caridad Everhart
*Assistant Examiner* — Ankush Singal
(74) *Attorney, Agent, or Firm* — Amerson Law Firm, PLLC

(57) ABSTRACT

One illustrative method disclosed herein includes forming a multi-layered sidewall spacer (MLSS) around a vertically oriented channel semiconductor structure, wherein the MLSS comprises a non-sacrificial innermost first spacer (a high-k insulating material), a sacrificial outermost spacer and at least one non-sacrificial second spacer (a metal-containing material) positioned between the innermost spacer and the outermost spacer, removing at least a portion of the sacrificial outermost spacer from the MLSS while leaving the at least one non-sacrificial second spacer and the non-sacrificial innermost first spacer in position and forming a final conductive gate electrode in place of the removed sacrificial outermost spacer.

30 Claims, 13 Drawing Sheets

(56) References Cited

U.S. PATENT DOCUMENTS

| | | |
|---|---|---|
| 7,241,655 B2 | 7/2007 | Tang et al. |
| 7,465,622 B2 | 12/2008 | Lin |
| 7,666,733 B2 | 2/2010 | Deleonibus |
| 7,700,432 B2 | 4/2010 | Chaudhry et al. |
| 8,637,849 B2 | 1/2014 | Deligianni et al. |
| 9,177,785 B1* | 11/2015 | Kelly ............... H01L 21/02236 |
| 9,224,840 B2 | 12/2015 | Flachowsky et al. |
| 9,287,362 B1* | 3/2016 | Basu ................... H01L 29/152 |
| 9,385,195 B1* | 7/2016 | Zhang ................ H01L 29/1033 |
| 9,530,863 B1* | 12/2016 | Zhang ............... H01L 29/66545 |
| 9,530,866 B1* | 12/2016 | Zhang ............... H01L 29/66666 |
| 9,640,636 B1* | 5/2017 | Bentley ............. H01L 29/66666 |
| 9,660,028 B1* | 5/2017 | Cheng ................ H01L 29/0673 |
| 2003/0047749 A1 | 3/2003 | Chaudhry et al. |
| 2003/0119237 A1 | 6/2003 | Chittipeddi et al. |
| 2007/0111414 A1 | 5/2007 | Chaudhry et al. |
| 2009/0085088 A1* | 4/2009 | Takaishi ......... H01L 21/823487 257/314 |
| 2011/0253981 A1* | 10/2011 | Rooyackers ........... B82Y 10/00 257/24 |
| 2013/0341702 A1 | 12/2013 | Kar et al. |
| 2014/0353593 A1* | 12/2014 | Smets ............... H01L 29/66666 257/39 |
| 2015/0091100 A1* | 4/2015 | Xie .................. H01L 21/76224 257/401 |
| 2015/0137271 A1* | 5/2015 | Cai .................. H01L 29/66545 257/411 |
| 2016/0005850 A1 | 1/2016 | Zhao et al. |
| 2016/0284712 A1* | 9/2016 | Liaw ................. H01L 27/1104 |

OTHER PUBLICATIONS

Hergenrother et al., "The Vertical Replacement-Gate (VRG) MOSFET: A 50-nm Vertical MOSFET with Lithography-Independent Gate Length," IEDM 99-75-78, IEEE 1999.

* cited by examiner

US 9,799,751 B1

METHODS OF FORMING A GATE STRUCTURE ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming a gate structure on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a simplistic depiction of an illustrative prior art vertical transistor device 10. In general, the vertical transistor 10 comprises a generally vertically oriented channel semiconductor structure 12A that extends upward from a front surface 12S of a semiconductor substrate 12. The semiconductor structure 12A may have a variety of different configurations when viewed from above, e.g., circular, rectangular, square, etc. The device 10 further comprise a channel region 13, a gate-all-around (GAA) gate structure 14, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application.

For many early device technology generations, the gate electrode structures of most transistor elements have comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

FIGS. 1B-1F simplistically depict one illustrative prior art process flow that is employed to form replacement gate structures on vertical transistor devices. FIG. 1B depicts the device 10 after several process operations were performed. First, a plurality of the above-described vertically oriented channel semiconductor structures 12A are formed above the substrate 12. Thereafter, several layers of material were sequentially deposited above the substrate: a layer of spacer material for the bottom spacer 15B, a sacrificial layer of material 21 (e.g., silicon dioxide) and a layer of spacer material for the top spacer 15T. Also depicted in FIG. 1B is a patterned etch mask layer 23. The patterned etch mask 23 may be made of a variety of different materials, e.g., photoresist, a combination of layers, etc.

FIG. 1C depicts the device 10 after an etching process was performed through the patterned etch mask 23 to remove the exposed portions of the top spacer layer 15T. The etching process stops on the sacrificial layer 21. FIG. 1C depicts the device after the patterned etch mask 23 was removed.

FIG. 1D depicts the device after a wet etching process was performed to remove the sacrificial layer 21 relative to the surrounding materials so as to define a plurality of replacement gate cavities 25.

FIG. 1E depicts the device 10 after simplistically depicted materials 14 for the replacement gate structure were formed so as to overfill the replacement gate cavities 25. The materials 14 for the replacement gate structure would normally include a high-k gate insulation layer (not separately shown), one or more additional metal-containing layers (e.g., work function adjusting metal layers), such as titanium nitride, and a bulk conductive fill material, such as tungsten or polysilicon. The high-k insulation layer and the additional metal-containing layers are typically formed by performing a conformal deposition process.

FIG. 1F depicts the device 10 after several process operations were performed. First, a chemical mechanical planarization (CMP) process was performed to planarize the upper surface of the gate materials 14 with the upper surface 15S of the patterned top spacer layer 15T. Thereafter, one or more anisotropic etching processes were performed to remove exposed portions of the gate materials 14, wherein the etching process ultimately stops on the layer of bottom spacer material 15B. As depicted, these operations result in the formation of separate GAA gate structures 14 that wrap around the channel portion 13 of the devices. Importantly, using this prior art process flow, the gate structures 14 are not self-aligned in that the lateral width 14L of the gate structure 14 is approximately defined by the lateral width 15L of the patterned features of the top spacer layer 15T. Since these features are defined by a patterning process, e.g., masking and etching, the control of the exact size and exact positioning of these patterned features is subject to the problems generally encountered when defining features using patterning processes such as, for example, positional accuracy relative to other structures (like the structures 12A), pattern transfer variations, etc. These types of issues are only expected to be more problematic as device dimensions continue to decrease with advancing technology.

The present disclosure is directed to methods of forming a gate structure on a vertical transistor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate structure on a vertical transistor device. One illustrative method disclosed herein includes, among other things, forming a multi-layered sidewall spacer around a vertically oriented channel semiconductor structure, wherein the multi-layered sidewall spacer comprises a non-sacrificial innermost first spacer (a high-k insulating material), a sacrificial outermost spacer and at least one non-sacrificial second spacer (a metal-containing material) positioned between the innermost spacer and the outermost spacer, removing at least a portion of the sacrificial outermost spacer from the multi-layered sidewall spacer while leaving the at least one non-sacrificial second spacer and the non-sacrificial innermost first spacer in position, and forming a final conductive gate electrode in place of the removed sacrificial outermost spacer.

Another illustrative method disclosed herein includes, among other things, forming a vertically oriented channel semiconductor structure, forming an initial multi-layered sidewall spacer around an entire perimeter of the vertically oriented channel semiconductor structure, wherein the initial multi-layered sidewall spacer has an initial height and comprises a non-sacrificial innermost first spacer comprised of a high-k insulating material, a sacrificial outermost spacer and at least one non-sacrificial second spacer comprised of a metal-containing material positioned between the non-sacrificial innermost first spacer and the sacrificial outermost spacer, and performing at least one recess etching process on the initial multi-layered sidewall spacer to thereby define a recessed multi-layered sidewall spacer having a recessed height that is less than the initial height of the initial multi-layered sidewall spacer. In this example, the method further includes performing at least one etching process to remove at least a portion of the sacrificial outermost spacer from the recessed multi-layered sidewall spacer while leaving the at least one non-sacrificial second spacer and the non-sacrificial innermost first spacer in position and thereby define a replacement gate electrode cavity and forming a final conductive gate electrode in the replacement gate electrode cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
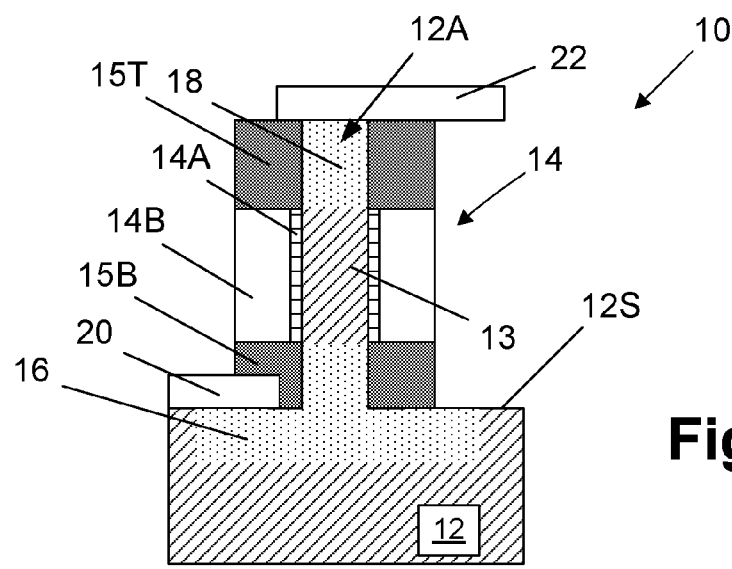
FIGS. 1A-1F simplistically depict an illustrative prior art vertical transistor device and a prior art method of forming a replacement gate structure on such a device.
Figure 1B:
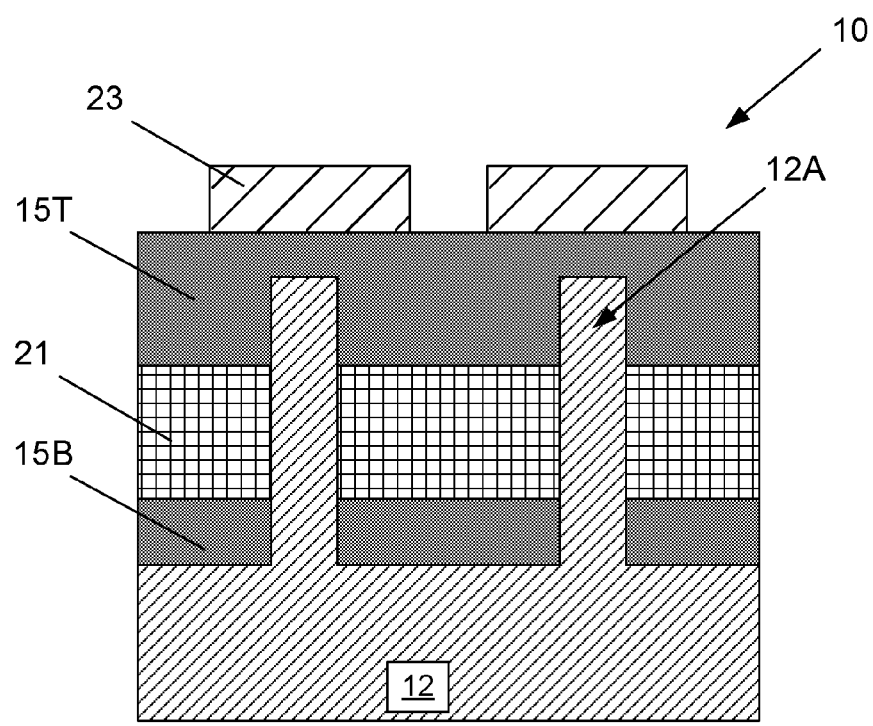
Figure 1C:
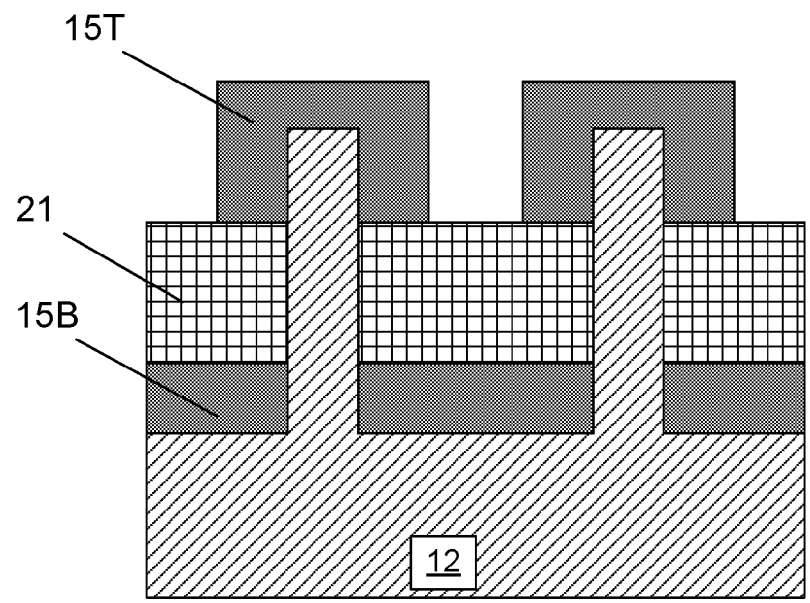
Figure 1D:
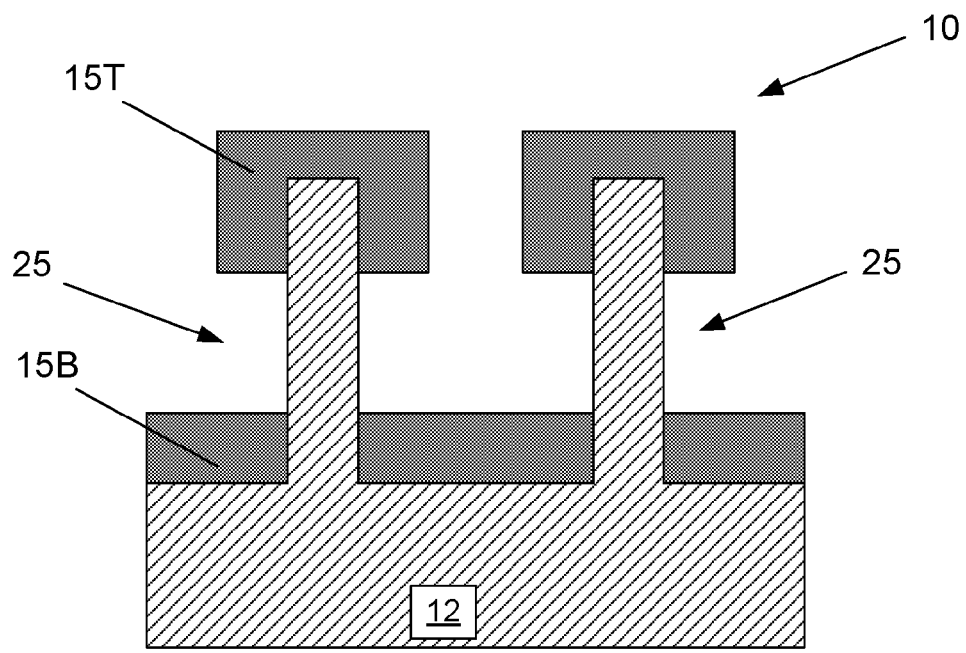
Figure 1E:
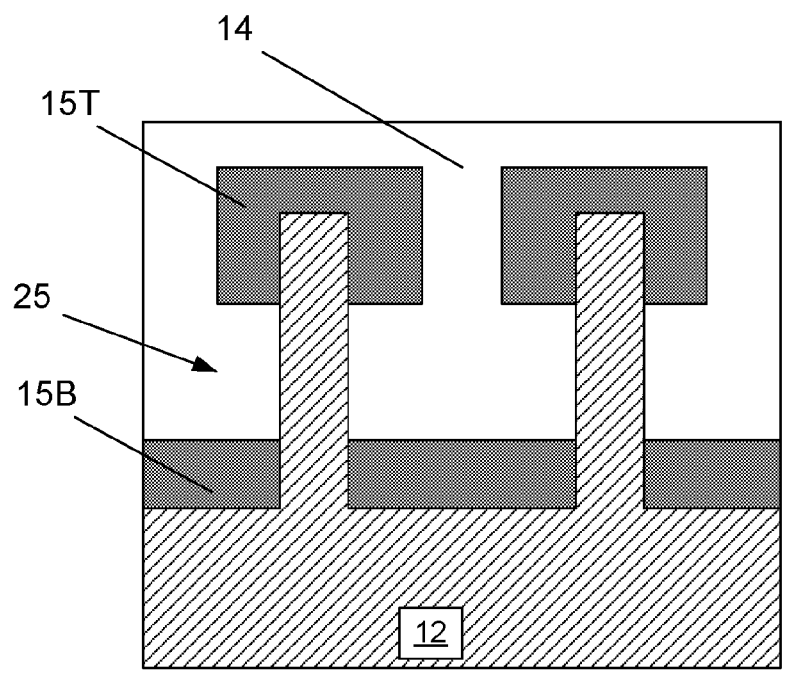
Figure 1F:
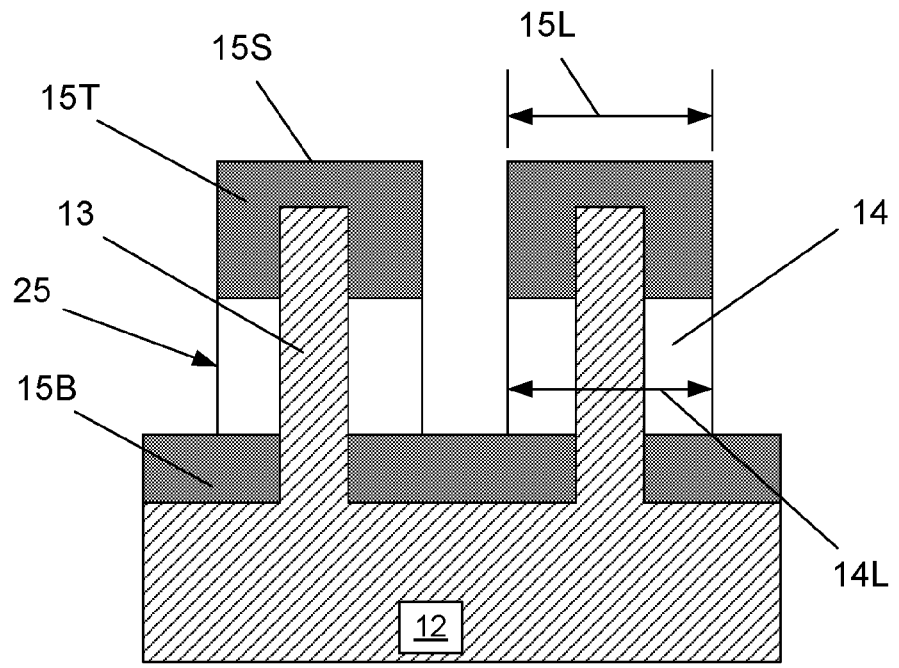

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
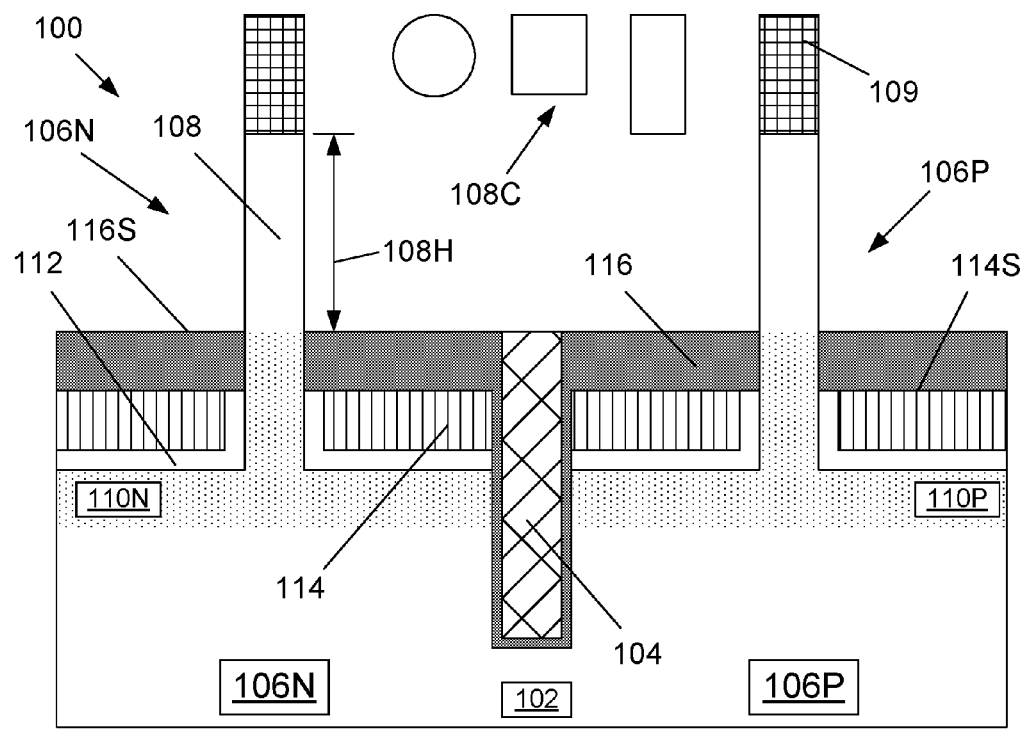
FIGS. 2A-2S depict various illustrative novel methods disclosed herein for forming a gate structure on a vertical transistor device.

FIG. 2A depicts one illustrative embodiment of an integrated circuit product 100 disclosed herein at an early stage of fabrication wherein several process operations have already been performed. In general, the product 100 will be formed in and above a substrate 102. The substrate 102 may have a variety of configurations, such as the depicted bulk silicon configuration. The substrate 102 may also have a semiconductor-on-insulator (SOI) or a silicon-on-insulator configuration that includes a bulk silicon layer, a buried insulation layer (silicon dioxide) and an active layer (silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

With continuing reference to FIG. 2A, the product 100 is generally comprised of an N-type vertical transistor device 106N and a P-type vertical transistor device 106P. An illustrative isolation region 104 separates the two devices 106N, 106P. As depicted, a vertically oriented channel semiconductor structure 108 has been formed for each of the devices 106N, 106P. The vertically oriented channel semiconductor structures 108 may have a variety of different configurations 108C when viewed from above, e.g., circular, square, rectangular, etc., as indicated in FIG. 2A. In the depicted example, the vertically oriented channel semiconductor structures 108 are defined by performing one or more etching processes through a patterned etch mask 109. In the illustrative example depicted in the attached figures, the vertically oriented channel semiconductor structures 108 are all of a uniform size and shape. However, such uniformity in the size and shape of the vertically oriented channel semiconductor structures 108 is not required to practice at least some aspects of the inventions disclosed herein. In the example depicted herein, the vertically oriented channel semiconductor structures 108 are depicted as having been formed by performing an anisotropic etching process. In other cases, the vertically oriented channel semiconductor structures 108 may be formed in such a manner that they have a tapered cross-sectional configuration (wider at the bottom than at the top at this point in the process flow). Thus, the size and configuration of the vertically oriented channel semiconductor structures 108 and the manner in which they are made should not be considered a limitation of the present invention.

Also depicted in FIG. 2A are bottom source/drain (S/D) regions 110N, 110P, a conductive liner 112 (e.g., tungsten silicide), a conductive metal layer 114 (e.g., tungsten) and a bottom spacer layer 116 (e.g., silicon nitride). All of the layers of material 112, 114 and 116 are formed around the entire outer perimeter of the vertically oriented channel semiconductor structures 108. The conductive liner 112 and the conductive metal layer 114 collectively constitute a bottom electrode for the devices 106N, 106P that may be used to conductively contact their respective bottom S/D regions 110N, 110P. The bottom S/D region 110N comprises N-type dopant atoms, while the bottom S/D region 110P comprises P-type dopant atoms, and they may be formed by performing one or more ion implantation processes through patterned implant masks (not shown). The implantation processes that are performed to form the bottom S/D regions 110N, 110P may be performed before or after the formation of the vertically oriented channel semiconductor structures 108. The conductive liner 112 may be formed by performing a conformal deposition process and its thickness may vary depending upon the particular application. After the formation of the metal layer 114, a recess etching process may be performed to remove portions of the conductive liner 112 from the sides of the vertically oriented channel semiconductor structures 108 and to recess the conductive metal layer 114 such that it has a recessed upper surface 114S as depicted in FIG. 2A. Thereafter, the bottom spacer layer 116 was deposited and recessed such that it has a recessed upper surface 116S as depicted in FIG. 2A. The height 108H of the vertically oriented channel semiconductor structures 108 (above the upper surface 116S of the bottom spacer layer 116) may vary depending upon the particular application.

Figure 2B:
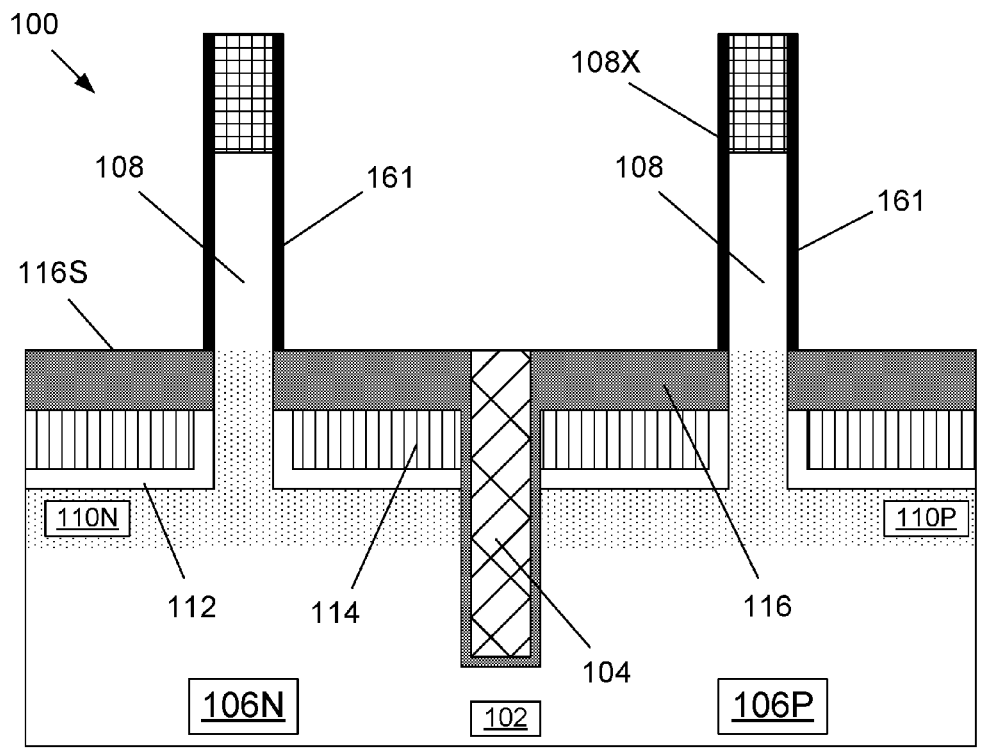

FIG. 2B depicts the product 100 after a non-sacrificial first sidewall spacer 161 was formed around the entire perimeter of each of the vertically oriented channel semiconductor structures 108 above the surface 116S of the bottom spacer layer 116. In the depicted example, the spacers 161 are formed on and in contact with the outer surface or sidewall 108X (which may have only a single sidewall if the vertically oriented channel semiconductor structures 108 have a generally circular configuration when viewed from above) of the vertically oriented channel semiconductor structures 108. The spacers 161 are comprised of a high-k insulating material (k value of 10 or greater), such as zirconium oxide ($ZrO_2$), hafnium oxide ($HfO_2$), hafnium zirconium oxide ($HfZrO_x$), $HfSiO_xN_y$, niobium oxide ($Nb_xO_y$), cerium oxide ($CeO_2$), tantalum oxide ($Ta_2O_5$), titanium tantalum oxide ($TiTa_xO_y$), strontium titanate ($SrTiO_3$) aluminum oxide ($Al_2O_3$), lanthanum oxide ($La_2O_3$), nickel oxide ($Ni_xO_y$), titanium oxide ($TiO_2$), zinc oxide (ZnO), etc., and combinations of such materials. The spacers 161 were formed by performing a first conformal deposition process to deposit a layer of spacer material and thereafter performing a first anisotropic etching process. The spacers 161 may be formed to any desired thickness. In one illustrative embodiment, the spacer 161 may have a lateral width at the base of the spacer 161 (at the point where it contacts the upper surface 116S of the bottom spacer layer 116) that falls within the range of about 2-8 nm. As will be appreciated by those skilled in the art after a complete reading of the present application, a portion of the spacer 161 will become the gate insulation layer for the final gate structure of the vertical device when the processing described herein is completed.

Figure 2C:
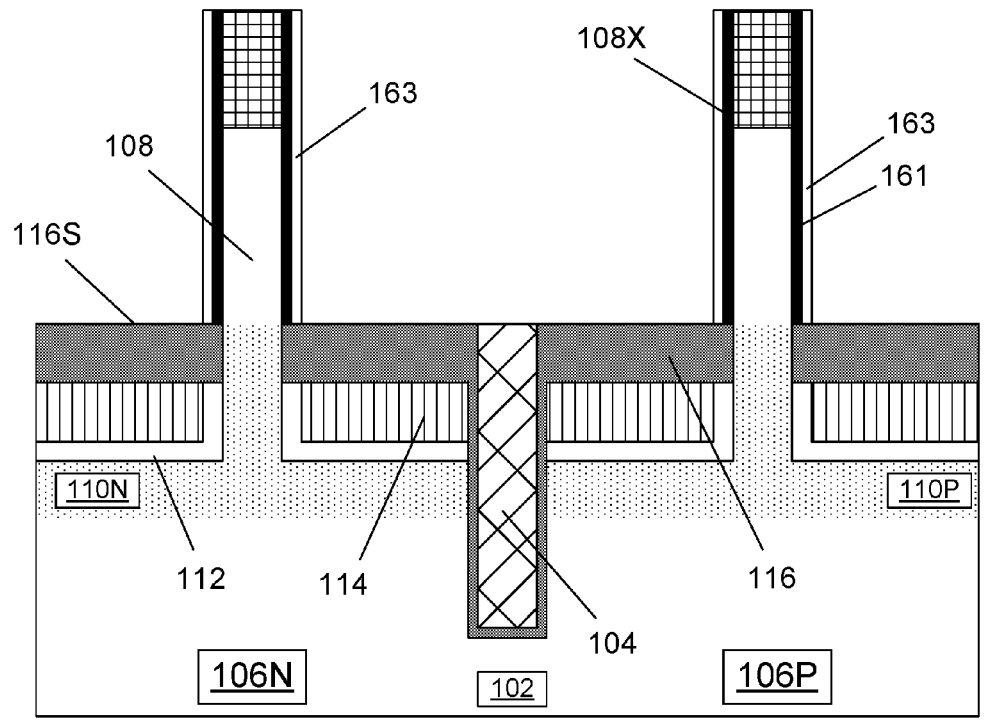

FIG. 2C depicts the product 100 after a non-sacrificial second sidewall spacer 163 was formed adjacent the first sidewall spacer 161 above the surface 116S of the bottom spacer layer 116. The second sidewall spacer 163 was also formed around the entire perimeter of the vertically oriented channel semiconductor structures 108. In the depicted example, the spacers 163 are formed on and in contact with the outer surface of the first spacers 161. The spacers 163 may be comprised of any of a variety of different metal-containing materials, e.g., a work function adjusting material, a substantially pure metal, a metal alloy, such as titanium nitride, nickel nitride, or a combination of electrically conductive metal nitrides, etc. The spacers 163 were formed by performing a second conformal deposition process to deposit a layer of spacer material and thereafter performing a second anisotropic etching process. The spacers 163 may be formed to any desired thickness. In one illustrative embodiment, the spacer 163 may have a lateral width at the base of the spacer 163 (at the point where it contacts the upper surface 116S of the bottom spacer layer 116) that falls within the range of about 2-8 nm. The materials of the spacers 163 need not be the same for both of the devices 106N, 106P in all applications, although such a situation may arise in some applications. Spacers 163 comprised of different materials may be formed on the devices 106N, 106P by use of appropriate masking layers to cover one of the devices while forming the spacer 163 on the exposed device. The use of such masking layers to allow processing of one device while masking another device is well known to those skilled in the art. As will be appreciated by those skilled in the art after a complete reading of the present application, a portion of the spacer 163 will become part of the final gate structure of the vertical device when the processing described herein is completed. Although not depicted, at this point, one or more additional non-sacrificial spacers may be formed adjacent the spacer 163, i.e., an additional metal-containing spacer, depending upon the desired composition of the final gate structures for the devices 106N, 106P, which may be different. Additionally, as noted above, such additional metal-containing spacers (if present) need not be formed on both of the devices 106N, 106P, i.e., such additional metal-containing spacers may only be formed on one of the devices by using appropriate masking layers.

Figure 2D:
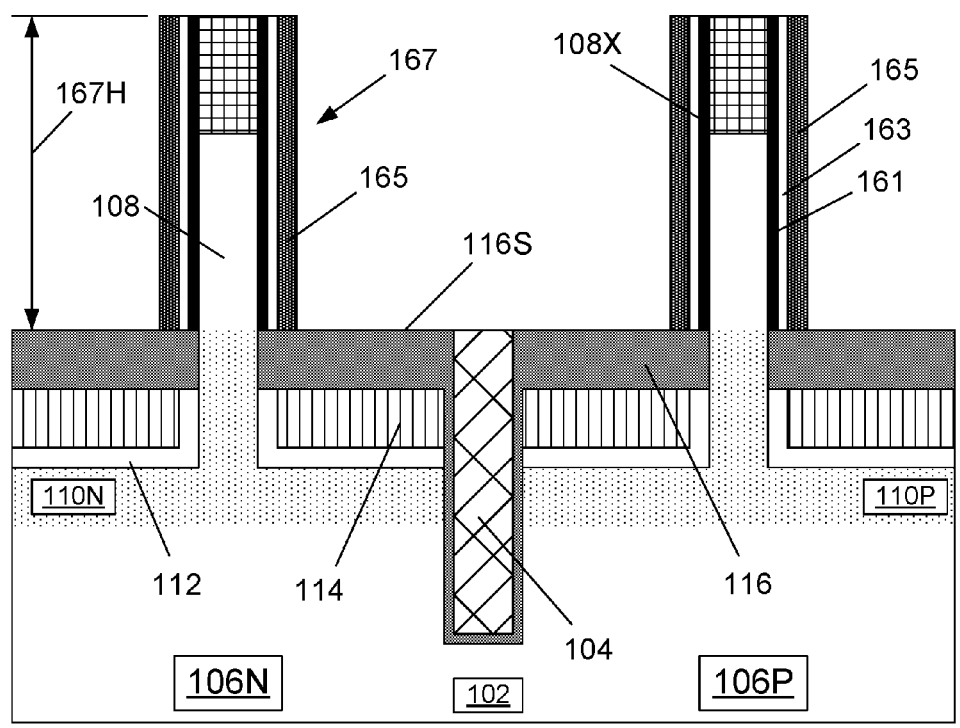

FIG. 2D depicts the product 100 after a third sacrificial sidewall spacer 165 was formed adjacent the second sidewall spacer 163 above the surface 116S of the bottom spacer layer 116. The third sacrificial sidewall spacer 165 was also formed around the entire perimeter of the vertically oriented channel semiconductor structures 108. In the depicted example, the sacrificial spacers 165 are formed on and in contact with the outer surface of the second spacers 163. However, as noted above, in at least some applications, one or more additional spacers (not shown) may be formed between the second spacer 163 and the third sacrificial spacer 165 on at least one (and perhaps both) of the devices 106N, 106P. As will be explained more fully below, the spacers 165 are sacrificial in nature and will eventually be removed and replaced with a conductive material that will serve as part of the gate electrode for the final gate structures of the devices 106N, 106P. The sacrificial spacers 165 may be comprised of a variety of different materials, e.g., amorphous silicon, polysilicon, etc. The sacrificial spacers 165 were formed by performing a third conformal deposition process to deposit a layer of spacer material and thereafter performing a third anisotropic etching process. The sacrificial spacers 165 may be formed to any desired thickness. In one illustrative embodiment, the sacrificial spacer 165 may have a lateral width at the base of the spacer 165 (at the point where it contacts the upper surface 116S of the bottom spacer layer 116) that falls within the range of about 4-20 nm.

As will be appreciated by those skilled in the art after a complete reading of the present application, at this point in the process flow, the above-described steps were performed to define an initial multi-layered spacer 167 adjacent and around the entire perimeter of the vertically oriented channel semiconductor structures 108 wherein the initial multi-layered spacer 167 comprises an innermost non-sacrificial high-k insulating material (the first spacer 161), at least one non-sacrificial metal-containing layer (the second spacer 163) and an outermost sacrificial layer (the third spacer 165). That is, the initial multi-layered spacer 167 was formed by performing a plurality, e.g., three, conformal deposition/ anisotropic etching process sequences to form the initial multi-layered sidewall spacer 167. At this point in the process flow, the initial multi-layered spacer 167 has an initial height 167H that is greater than the height 108H (see FIG. 2A) of the vertically oriented channel semiconductor structures 108. In the depicted example, the composition of the initial multi-layered spacer 167 is the same for both of the devices 106N, 106P, although, as noted above, that may not be the case in all applications.

Figure 2E:
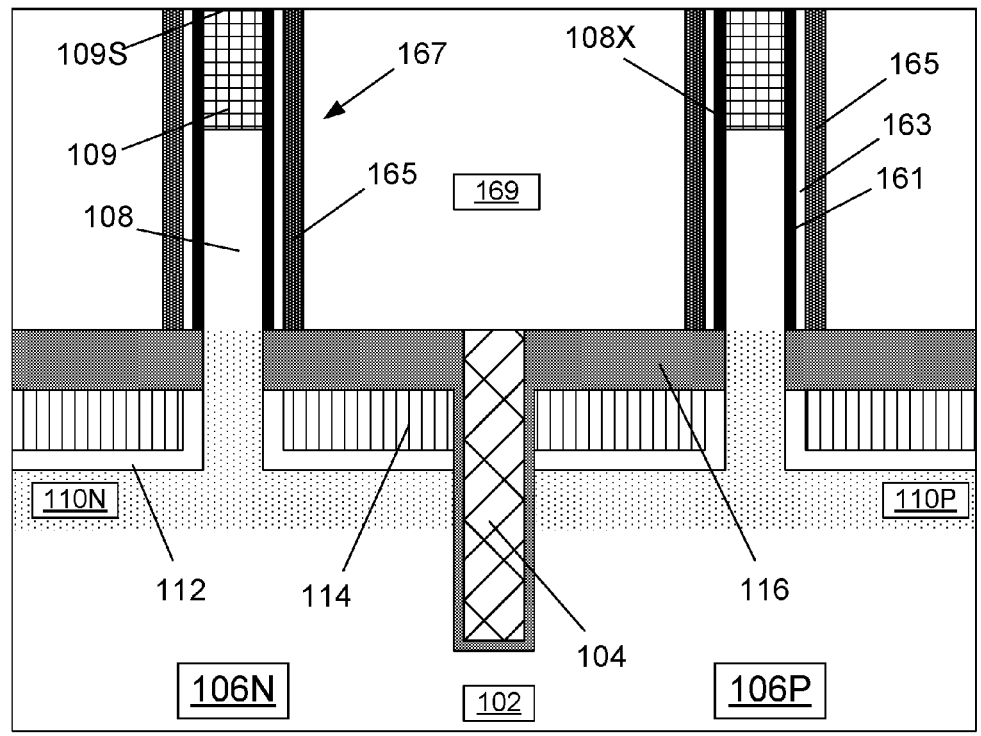

FIG. 2E depicts the product 100 after several process operations were performed. First, a layer of insulating material 169, e.g., a flowable oxide, silicon dioxide, etc., was formed above the product 100. Thereafter, at least one chemical mechanical polishing (CMP) process was performed to planarize the upper surface of the insulating material 169 with the upper surface 109S of the patterned hard mask layer 109.

Figure 2F:
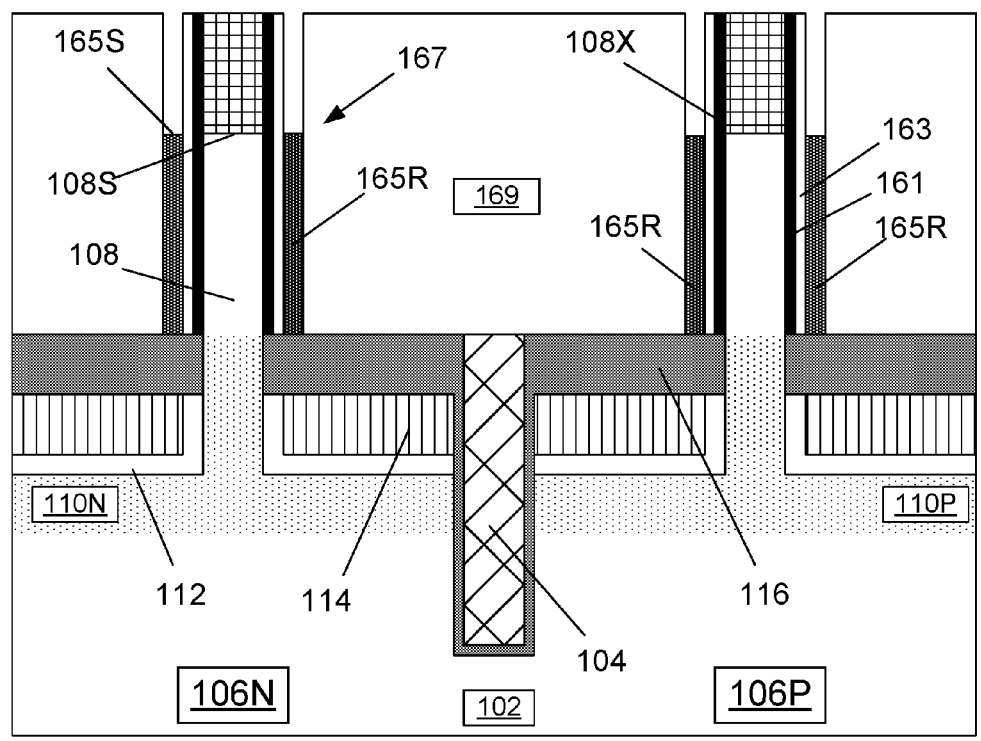

The next major process operation involves removing portions of the spacers 161, 163 and 165, i.e., removing portions of the initial multi-layered spacer 167, and removing the masking layer 109. A variety of different process flows may be performed to remove the desired portions of the initial multi-layered spacer 167, i.e., different layers may be removed in a different sequence than the illustrative example depicted herein. FIG. 2F depicts the product 100 after a recess etching process was performed to remove a portion of the sacrificial spacer 165 relative to surrounding materials and thereby define a recessed sacrificial spacer 165R. The amount of the sacrificial spacer 165 that is removed may vary depending upon the particular application. In the depicted example, the recess etching process is performed until such time as an upper surface 165S of the recessed sacrificial spacer 165R is substantially co-planar with an upper surface 108S of the vertically oriented channel semiconductor structures 108.

Figure 2G:
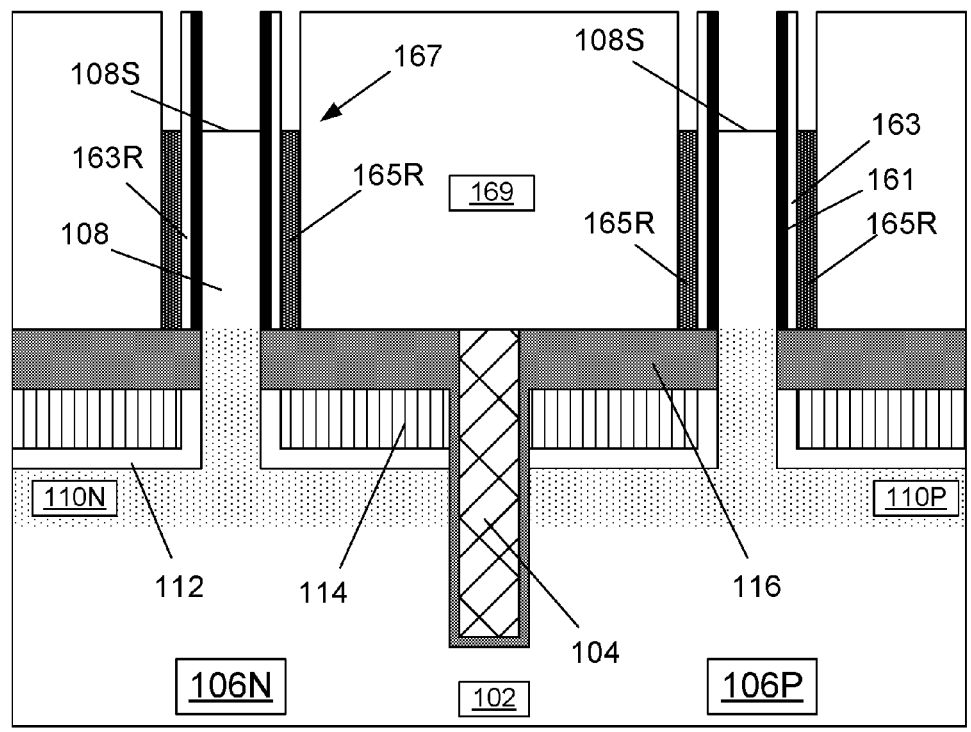

FIG. 2G depicts the product 100 after an etching process was performed to remove the entirety of the mask layer 109 relative to surrounding materials. This process operation results in the exposure of the upper surface 108S of the vertically oriented channel semiconductor structures 108.

Figure 2H:
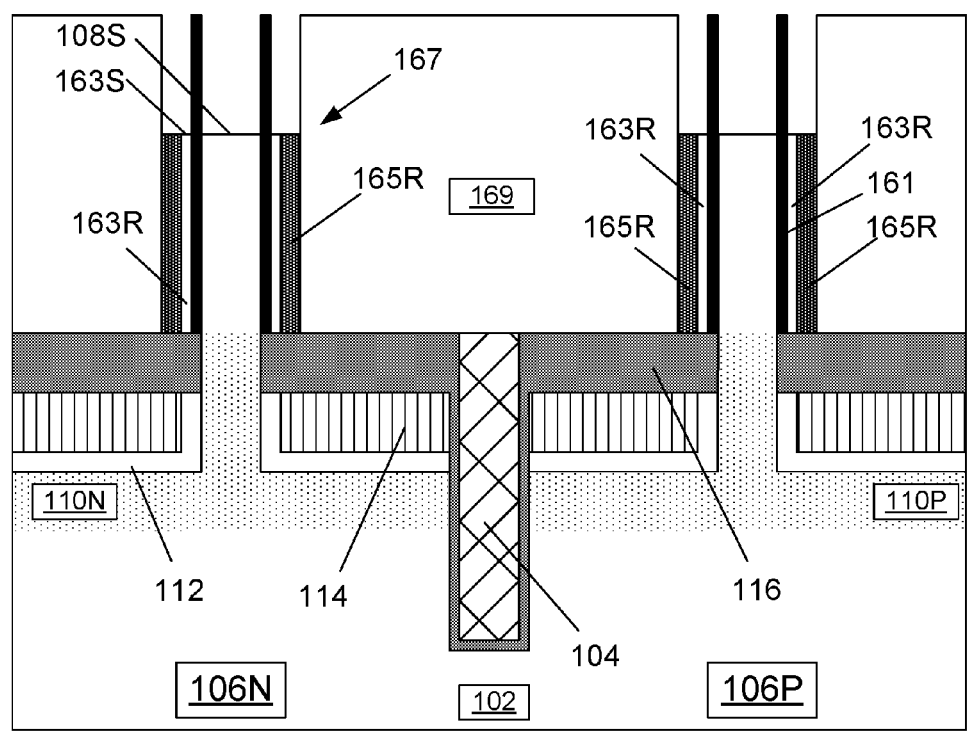

FIG. 2H depicts the product 100 after a recess etching process was performed to remove a portion of the second spacer 163 relative to surrounding materials and thereby define a recessed second spacer 163R. The amount of the second spacer 163 that is removed may vary depending upon the particular application. In the depicted example, the recess etching process is performed until such time as an upper surface 163S of the recessed second spacer 163R is substantially co-planar with the upper surface 108S of the vertically oriented channel semiconductor structures 108.

Figure 2I:
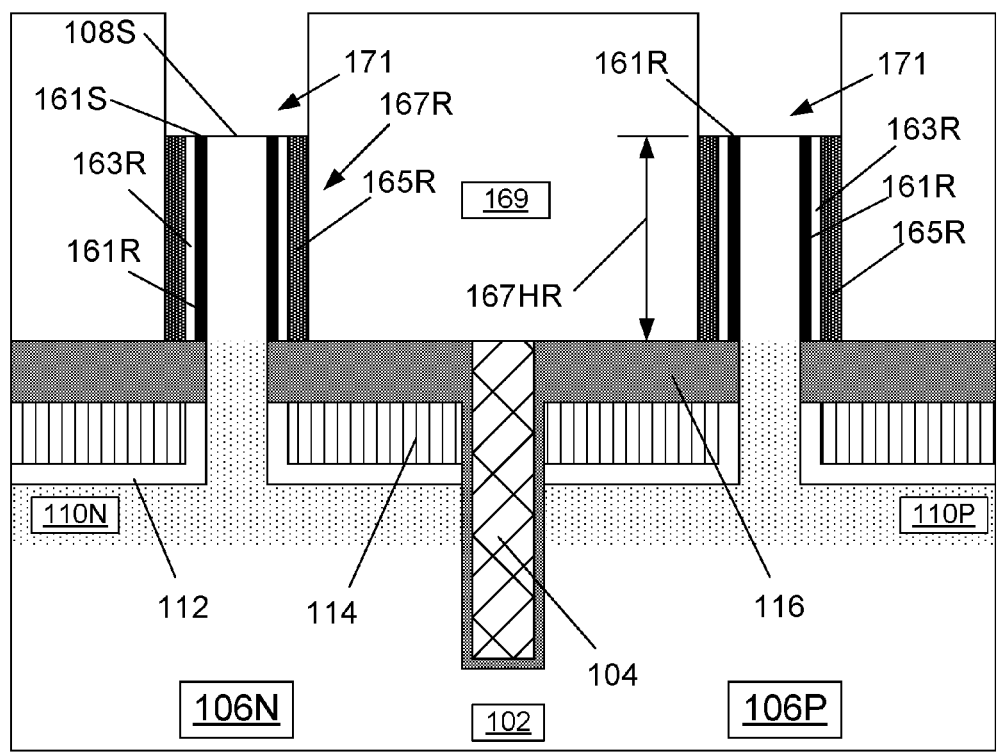

FIG. 2I depicts the product 100 after a recess etching process was performed to remove a portion of the first spacer 161 relative to surrounding materials and thereby define a recessed first spacer 161R. The amount of the first spacer 161 that is removed may vary depending upon the particular application. In the depicted example, the recess etching process is performed until such time as an upper surface 161S of the recessed first spacer 161R is substantially co-planar with the upper surface 108S of the vertically oriented channel semiconductor structures 108. Depending upon the materials of construction, the removal of the masking layer 109 and the recessing of the spacers 161, 163 and 165 may be performed in any desired order. In the depicted example, the spacers 161, 163 and 165 are all recessed to approximately the same height level, but such a situation is not required to practice at least some aspects of the presently disclosed inventions, i.e., the spacers 161, 163 and 165 may be recessed to different height levels. Collectively, the removal of the mask layer 109 and the recessing of the spacers 161, 163 and 165 results in the definition of a recessed multi-layered spacer 167R and the definition of a cavity 171 above the upper surface of the recessed multi-layered spacer 167R and the upper surface 108S of the vertically oriented channel semiconductor structure 108 that is surrounded by the insulating material 169. The recessed multi-layered spacer 167R has a recessed height 167HR that is less than the initial height 167H (see FIG. 2D) of the initial multi-layered spacer 167. In one illustrative embodiment, the recessed height 167HR may be about 30-80 nm less than the initial height 167H.

Figure 2J:
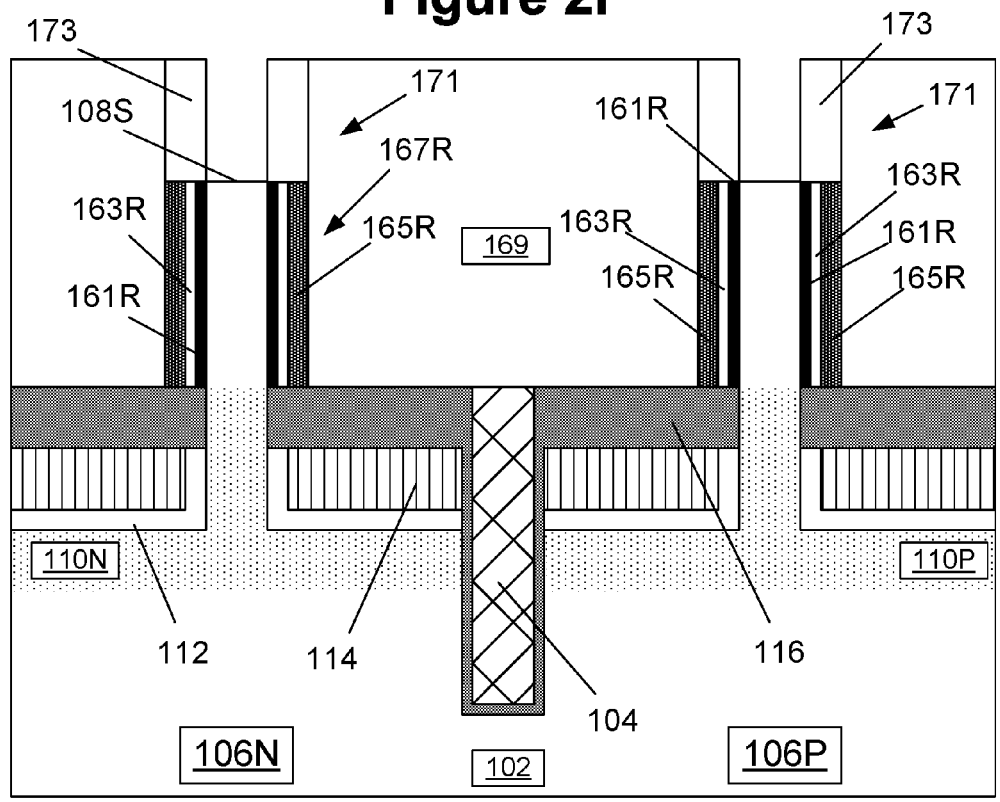

FIG. 2J depicts the product 100 after a sacrificial sidewall spacer 173 was formed within the cavities 171 above the recessed multi-layered spacer 167R while leaving at least a portion of the upper surfaces 108S of the vertically oriented channel semiconductor structures 108 exposed for further processing. In some applications, the sacrificial sidewall spacer 173 may be sized such that substantially the entire upper surfaces 108S of the vertically oriented channel semiconductor structures 108 will be exposed for further processing. The sacrificial sidewall spacer 173 was formed by depositing a layer of spacer material (e.g., silicon nitride, etc.) and thereafter performing an anisotropic etching process. In one illustrative embodiment, the sacrificial sidewall spacer 173 may have a lateral width at the base of the sacrificial sidewall spacer 173 that is approximately equal to a lateral width of the upper surface of the recessed multi-layered spacer 167R.

Figure 2K:
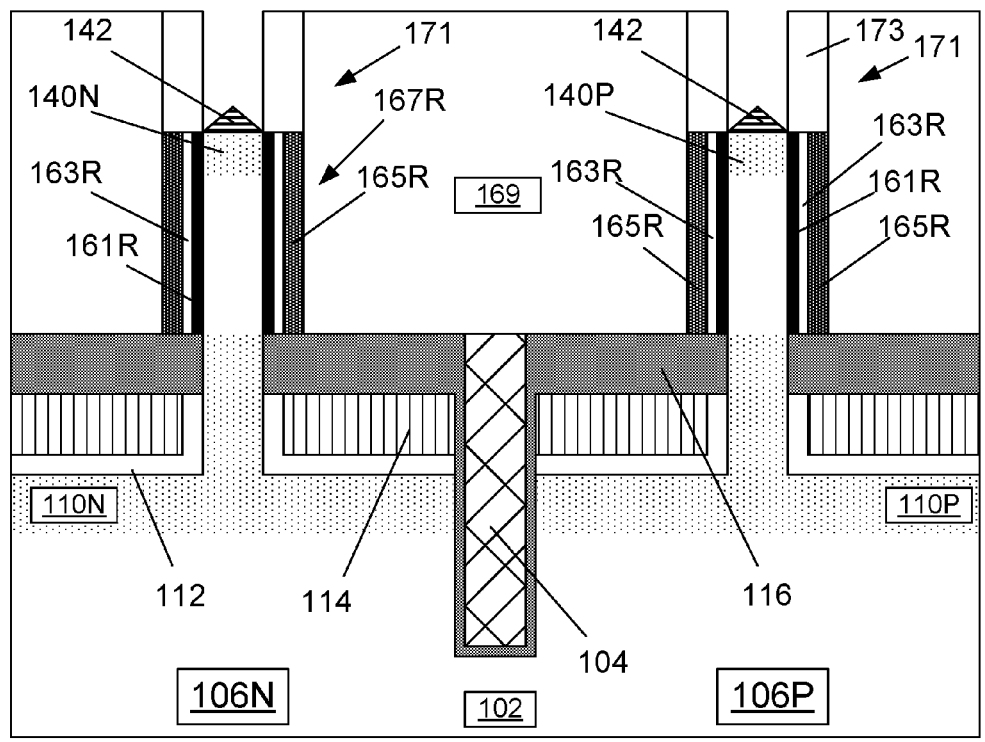

FIG. 2K depicts the product 100 after several process operations were performed. First, a top S/D region 140N (comprising N-type dopant atoms) and a top S/D region 140P (comprising P-type dopant atoms) were formed in the vertically oriented channel semiconductor structures 108 by performing one or more ion implantation processes through patterned implant masks (not shown) and through an opening defined by the sacrificial sidewall spacer 173. Then, an optional region of epi semiconductor material 142 was formed on the exposed upper surface 108S of the vertically oriented channel semiconductor structures 108 by performing an epitaxial growth process.

Figure 2L:
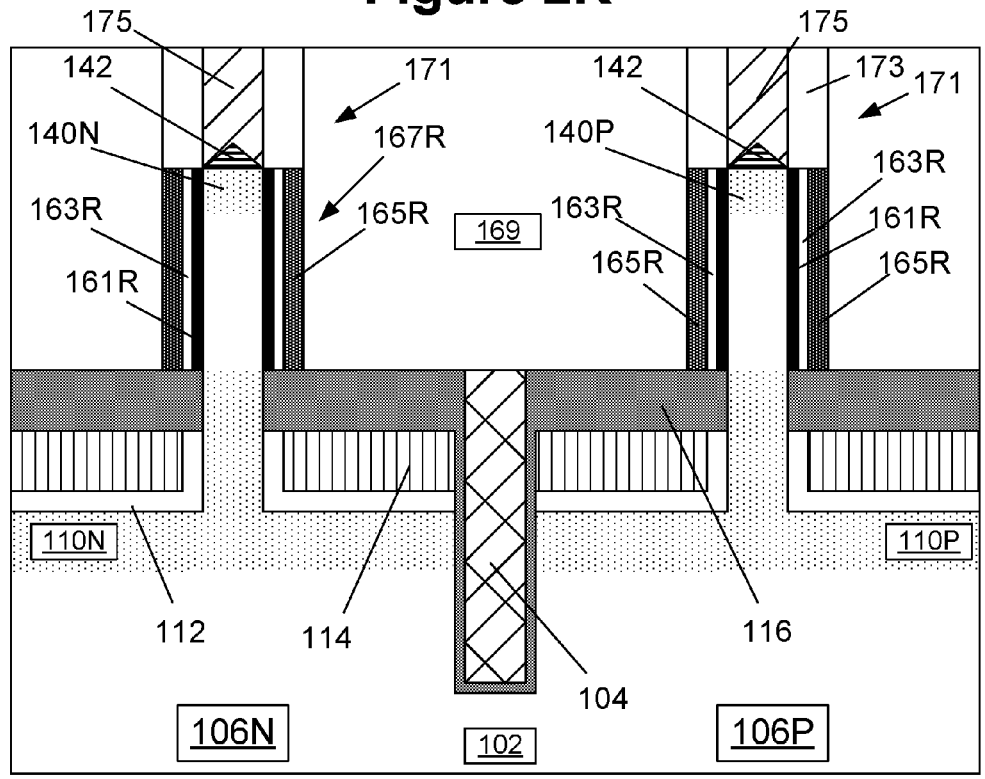

FIG. 2L depicts the product after a sacrificial plug material 175 was formed above the vertically oriented channel semiconductor structures 108 between the sacrificial sidewall spacers 173. The purpose of the sacrificial plug material 175 is to protect the underlying vertically oriented channel semiconductor structures 108 during subsequent processing operations. The sacrificial plug material 175 should be made of a material that will remain in place when the sacrificial spacer 173 is removed as described more fully below. In one illustrative embodiment, the sacrificial plug material 175 may be, for example, a spin-on glass material, OPL, etc. The sacrificial plug material 175 may be deposited so as to overfill the remaining un-filled portions of the cavities 171 and a CMP process may be performed so as to remove excess materials positioned above the upper surface of the insulating material 169.

Figure 2M:
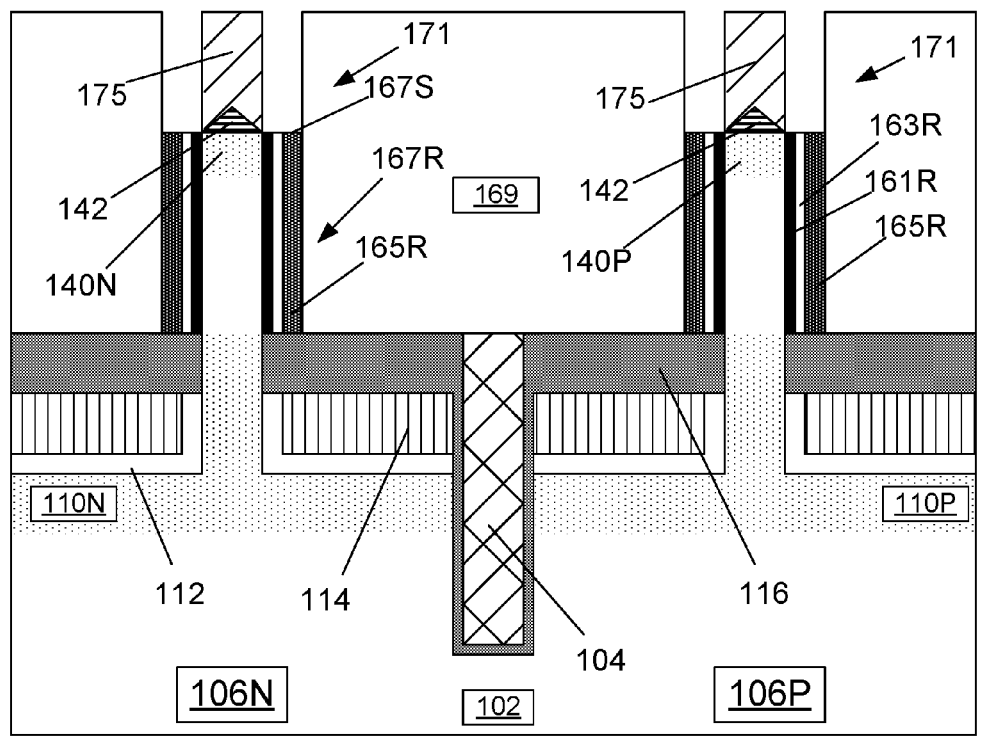

FIG. 2M depicts the product 100 after an etching process was performed to remove the entirety of the sacrificial sidewall spacer 173 relative to surrounding materials. This process operation results in the exposure of perhaps the entirety of the upper surface 167S (and at least the outermost spacer 165R) of the recessed multi-layered spacer 167R that was previously covered by the sacrificial spacer 173.

Figure 2N:
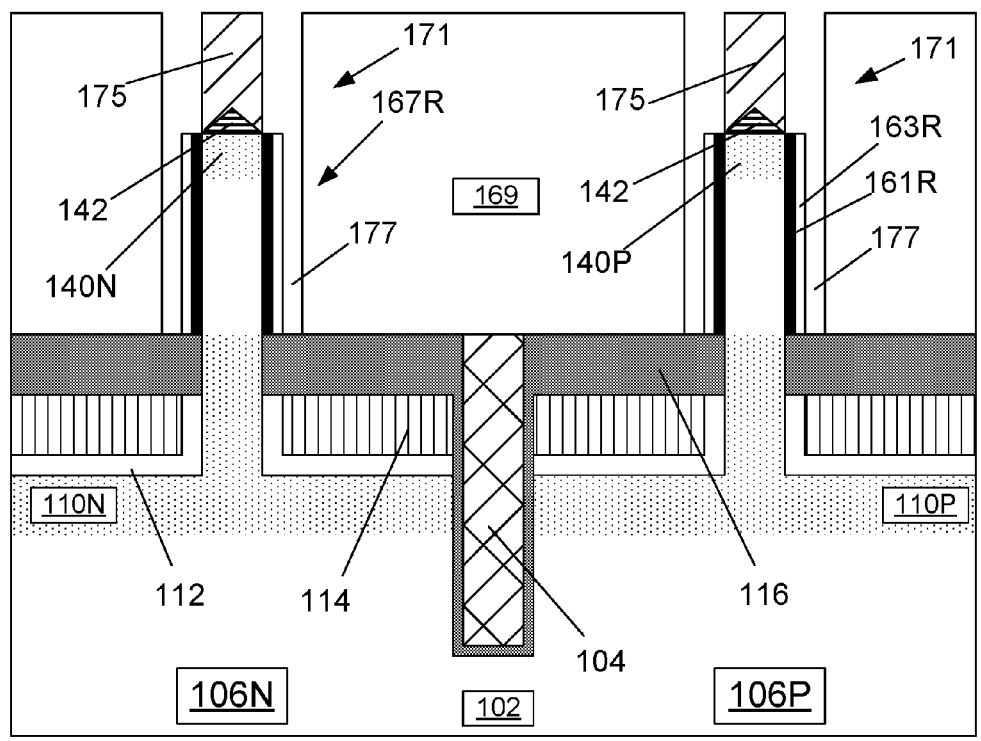

FIG. 2N depicts the product 100 after an etching process was performed to remove the entirety of the recessed sacrificial spacer 165R relative to surrounding materials. In one embodiment, this process operation results in the exposure of the non-sacrificial recessed second spacer 163R, the bottom spacer layer 116 and in the definition of a replacement gate electrode cavity 177 between the insulating material 169 and the non-sacrificial second sidewall spacer 163R. In some applications, it may not be necessary to remove the entirety of the recessed sacrificial spacer 165R and expose the bottom spacer layer 116, i.e., a small portion of the recessed sacrificial spacer 165R may remain in the bottom of the replacement gate electrode cavity 177.

Figure 2O:
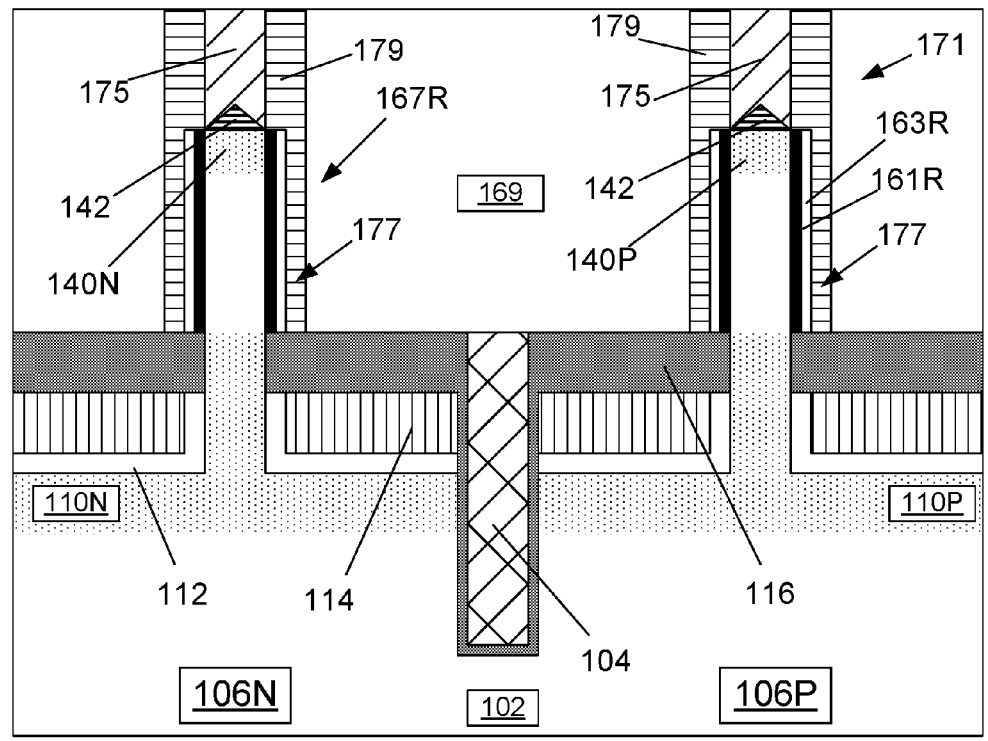

FIG. 2O depicts the product 100 after a conductive gate electrode 179 was formed in the replacement gate electrode cavity 177. The gate electrode 179 was formed by depositing an appropriate conductive material, such as a metal, a metal alloy, tungsten, aluminum, etc., so as to overfill the replacement gate electrode cavity 177 and thereafter performing a CMP process to remove excess materials positioned above the upper surface of the layer of insulating material 169.

Figure 2P:
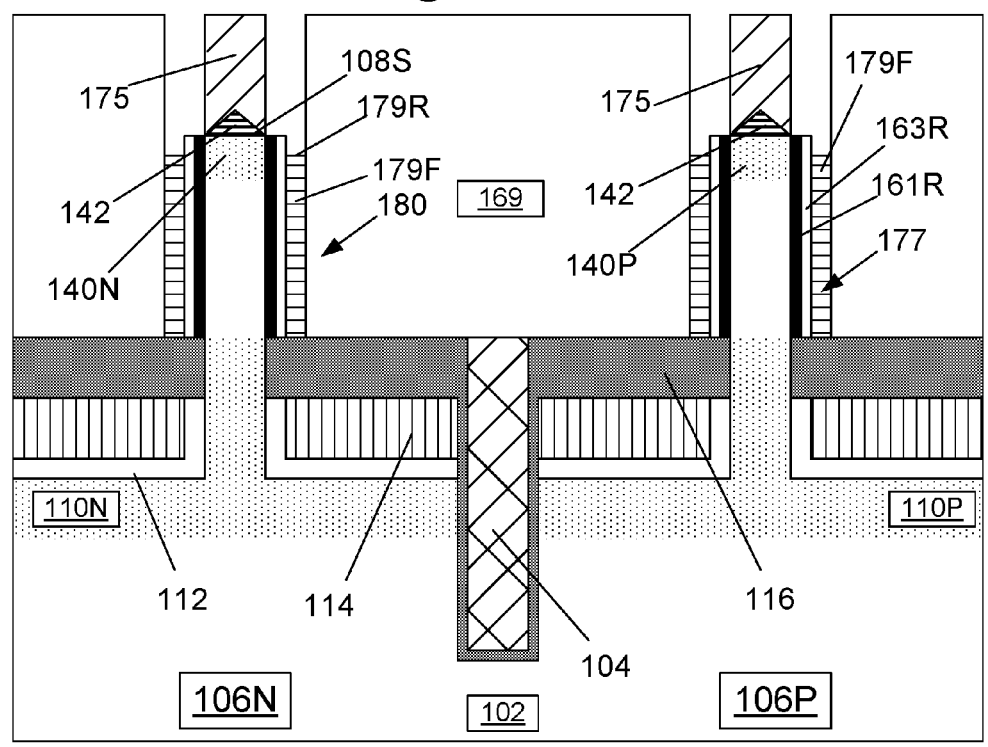

FIG. 2P depicts the product 100 after a recess etching process was performed to remove a portion of the conductive gate electrode 179 relative to surrounding materials and thereby define a final conductive gate electrode 179F for both of the devices 106N, 106P. The amount of the conductive gate electrode 179 that is removed may vary depending upon the particular application. In the depicted example, the recess etching process is performed until such time as an upper surface 179R of the final conductive gate electrode 179F is positioned slightly below (e.g., 4-20 nm) below the upper surface 108S of the vertically oriented channel semiconductor structures 108. Collectively, in the example depicted herein, the final conductive gate electrode 179F (a conductive material), the non-sacrificial recessed second spacer 163R (a metal-containing material), and the non-sacrificial recessed first spacer 161R (a high-k insulating material) constitute the final gate structure 180 for each of the devices 106N, 106P. Of course, as noted above, the final gate structures 180 for each of the devices 106N, 106P may be comprised of different materials. However, in some applications, the final gate structures 180 for the devices 106N, 106P will include the same material for the high-k insulating material (the spacer 161) and the same material for the final conductive gate electrode 179F.

Figure 2Q:
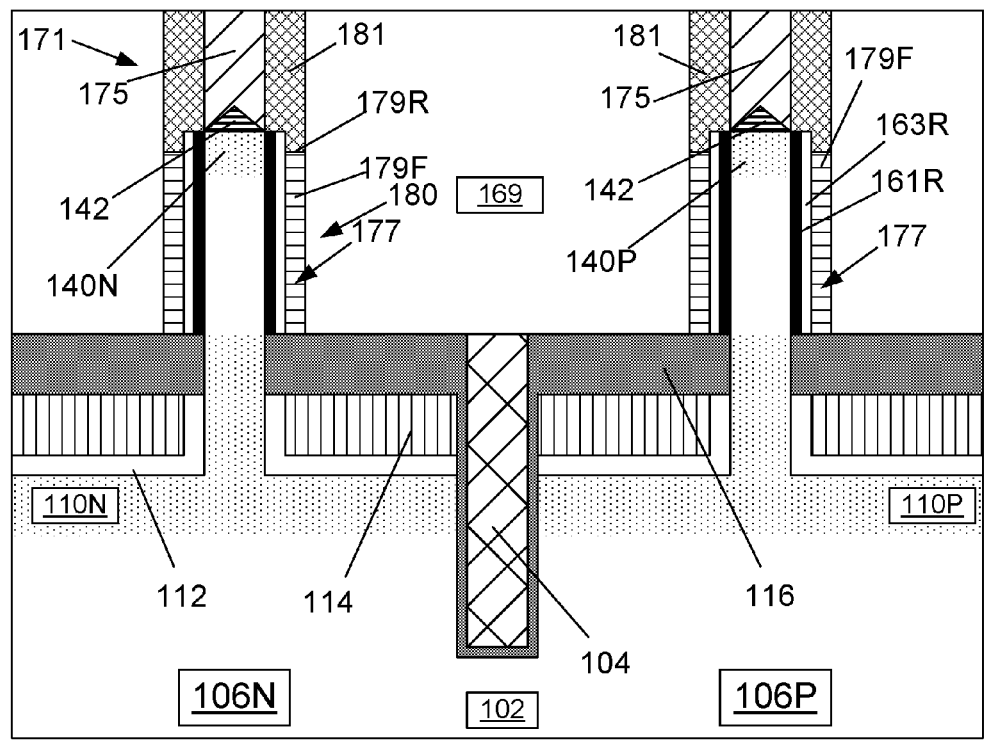

FIG. 2Q depicts the product after a gate cap 181 was formed above each of the final conductive gate electrodes 179F in the remaining un-filled portions of the cavities 171. The gate cap 181 may be made of a variety of different materials, e.g., a low-k material (k value of less than 5.5) and it should be made of a material that will remain in place when the sacrificial material 175 is removed as described more fully below. In one illustrative embodiment, the gate cap 181 may be, for example, SiOCN, SiBCN, etc. The gate caps 181 may be formed by depositing a layer of gate cap material so as to overfill the remaining un-filled portions of the cavities 171 and thereafter performing a CMP process so as to remove excess materials positioned above the upper surface of the insulating material 169.

Figure 2R:
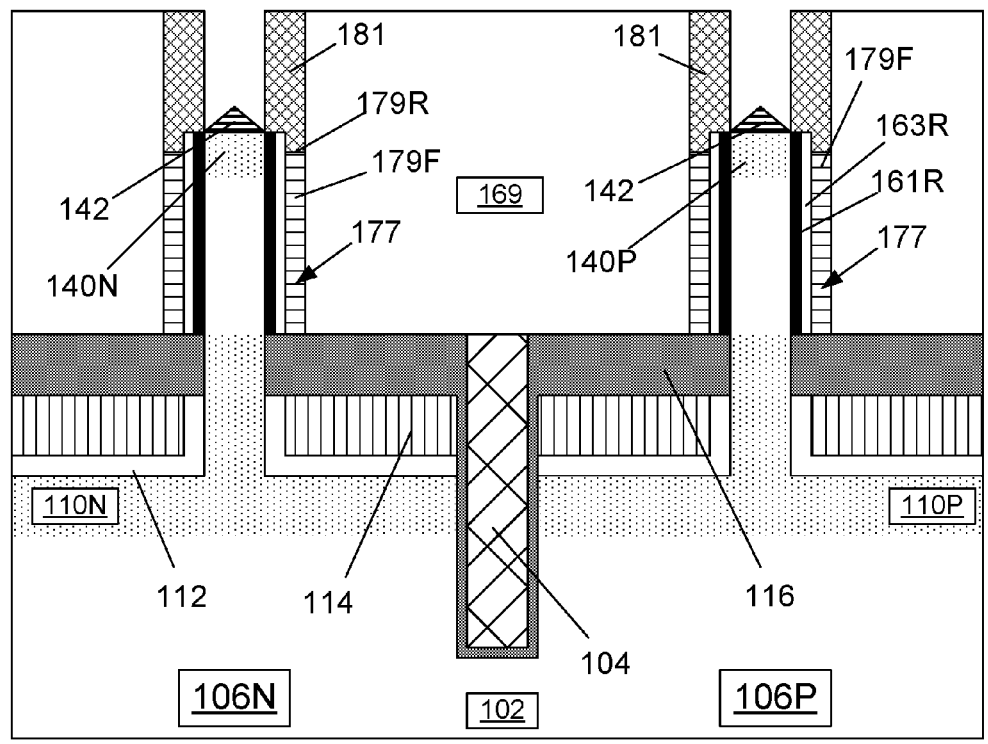

FIG. 2R depicts the product 100 after an etching process was performed to remove the entirety of the sacrificial material 175 relative to surrounding materials. In one embodiment, this process operation results in the exposure of the epi semiconductor materials 142 (in the depicted example).

Figure 2S:
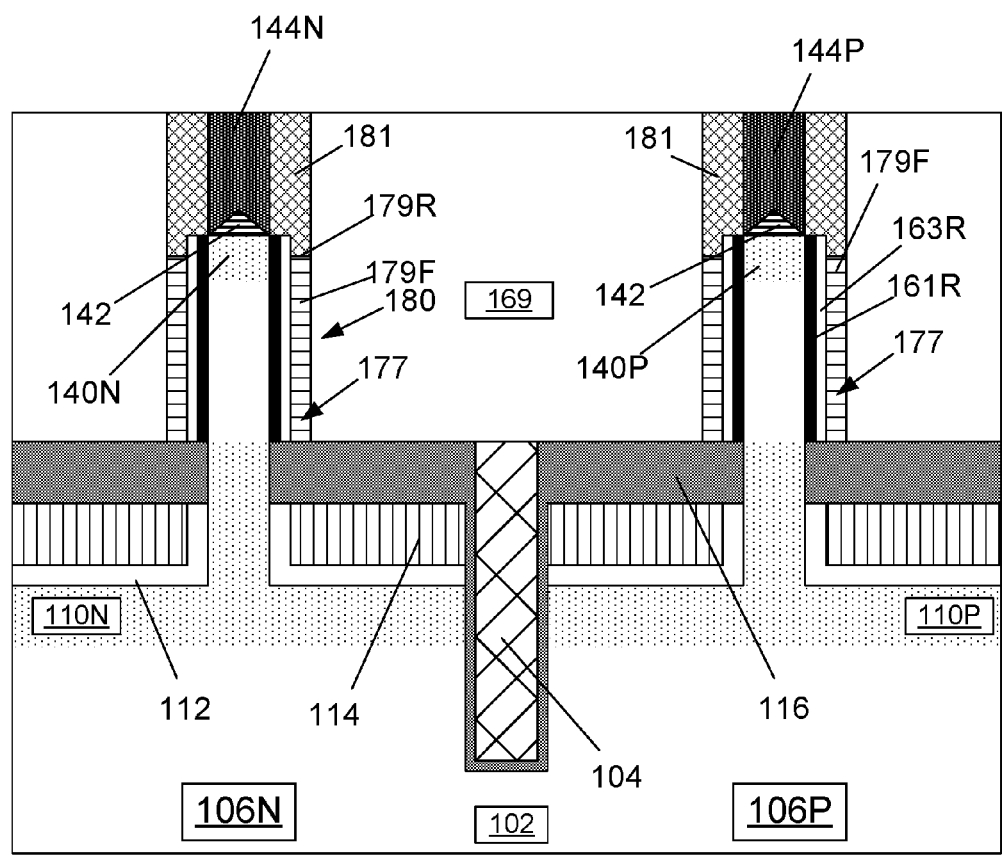

FIG. 2S depicts the product 100 after self-aligned upper S/D conductive contacts 144N, 144P were formed in the portion of the cavities 171 that are not occupied by the gate caps 181. The self-aligned upper S/D conductive contacts 144N, 144P are conductively coupled to the top S/D regions 140N, 140P, respectively. Note that the self-aligned upper S/D conductive contacts 144N, 144P are self-aligned in that their configuration is defined by the remaining unfilled portion of the cavities 171 at the time the upper S/D conductive contacts 144N, 144P are formed. Also note that, in one embodiment, the self-aligned upper S/D contacts 144N, 144P physically contact the gate cap 181 within its associated cavity 171. The upper S/D contacts 144N, 144P were formed by depositing an appropriate contact metal, such as tungsten, so as to overfill the cavities 171 above the epi semiconductor materials 142 (in the depicted example) and thereafter performing a CMP process to remove excess materials positioned above the upper surface of the layer of insulating material 169. Additionally, although not separately depicted, a metal silicide layer (not shown) may be formed on the epi semiconductor materials 142 prior to depositing the contact metal.

At the point of processing depicted in FIG. 2S, additional manufacturing processes may be performed to complete the fabrication of the device. For example, conductive contacts (not shown) may be formed through the insulating material 169 so as to establish electrical contact to the bottom electrodes for the devices 106N, 106P (i.e., the conductive liner 112 and the conductive metal layer 114) that conductively contact their respective bottom S/D regions 110N, 110P.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate structure on a vertical transistor device, the method comprising:
    forming a vertically oriented channel semiconductor structure;
    forming an initial multi-layered sidewall spacer around an entire perimeter of said vertically oriented channel semiconductor structure, wherein said initial multi-layered sidewall spacer has an initial height and comprises a non-sacrificial innermost first spacer comprised of a high-k insulating material, a sacrificial outermost spacer and at least one non-sacrificial second spacer comprised of a metal-containing material positioned between said non-sacrificial innermost first spacer and said sacrificial outermost spacer;
    performing at least one recess etching process on said initial multi-layered sidewall spacer to thereby define a recessed multi-layered sidewall spacer having a recessed height that is less than said initial height of said initial multi-layered sidewall spacer;
    performing at least one etching process to remove at least a portion of said sacrificial outermost spacer from said recessed multi-layered sidewall spacer while leaving said at least one non-sacrificial second spacer and said non-sacrificial innermost first spacer in position and thereby define a replacement gate electrode cavity; and
    forming a final conductive gate electrode in said replacement gate electrode cavity.

2. The method of claim 1, wherein said non-sacrificial innermost first spacer is formed on and in contact with a sidewall of said vertically oriented channel semiconductor structure and said at least one non-sacrificial second spacer is formed on and in contact with said non-sacrificial innermost first spacer.

3. The method of claim 1, wherein said sacrificial outermost spacer is formed on and in contact with said at least one non-sacrificial second spacer.

4. The method of claim 1, wherein said sacrificial outermost spacer comprises one of amorphous silicon or polysilicon, said at least one non-sacrificial second spacer comprises one of a work function adjusting material, a substantially pure metal, a metal alloy, titanium nitride, nickel nitride, or a combination of electrically conductive metal nitrides, said non-sacrificial innermost first spacer comprises one of zirconium oxide ($ZrO_2$), hafnium oxide ($HfO_2$), hafnium zirconium oxide ($HfZrO_x$), $HfSiO_xN_y$, niobium oxide ($Nb_xO_y$), cerium oxide ($CeO_2$), tantalum oxide ($Ta_2O_5$), titanium tantalum oxide ($TiTa_xO_y$), strontium titanate ($SrTiO_3$), aluminum oxide ($Al_2O_3$), lanthanum oxide ($La_2O_3$), nickel oxide ($Ni_xO_y$), titanium oxide ($TiO_2$) or zinc oxide (ZnO), and said final conductive gate electrode comprises a metal, a metal alloy, tungsten or aluminum.

5. The method of claim 1, wherein forming said initial multi-layered sidewall spacer around said entire perimeter of said vertically oriented channel semiconductor structure comprises performing a plurality of conformal deposition/anisotropic etching process sequences to form said initial multi-layered sidewall spacer.

6. The method of claim 1, wherein forming said initial multi-layered sidewall spacer around said entire perimeter of said vertically oriented channel semiconductor structure comprises:
    performing a first conformal deposition process and a first anisotropic etching process to form said non-sacrificial innermost first spacer;
    after forming said non-sacrificial innermost first spacer, performing a second conformal deposition process and a second anisotropic etching process to form said at least one non-sacrificial second spacer; and
    after forming said at least one non-sacrificial second spacer, performing a third conformal deposition process and a third anisotropic etching process to form said sacrificial outermost spacer.

7. The method of claim 1, wherein said replacement gate electrode cavity is at least partially defined by a layer of insulating material and said at least one non-sacrificial second spacer.

8. The method of claim 7, wherein said replacement gate electrode cavity is further defined by a bottom spacer of said vertical transistor device.

9. The method of claim 1, wherein performing said at least one etching process to remove at least a portion of said sacrificial outermost spacer comprises performing said at least one etching process to remove an entirety of said sacrificial outermost spacer.

10. The method of claim 1, wherein forming said final conductive gate electrode in said replacement gate electrode cavity comprises:
 depositing a conductive material so as to overfill said replacement gate electrode cavity;
 performing a planarization process so as to planarize an upper surface of said deposited conductive material; and
 after performing said planarization process, performing a recess etching process to remove a portion, but not all, of said deposited conductive material.

11. The method of claim 1, wherein, prior to performing said at least one etching process to remove at least a portion of said sacrificial outermost spacer, the method comprises:
 forming a sacrificial spacer above an upper surface of said recessed multi-layered sidewall spacer while leaving at least a portion of an upper surface of said vertically oriented channel semiconductor structure exposed;
 performing an ion implantation process through an opening defined by said sacrificial spacer so as to form a top source/drain region in said vertically oriented channel semiconductor structure;
 after performing said ion implantation process, forming a sacrificial plug material in said opening defined by said sacrificial spacer and above said upper surface of said vertically oriented channel semiconductor structure; and
 removing said sacrificial spacer while leaving said sacrificial plug material in position so as to thereby expose said upper surface of said recessed multi-layered sidewall spacer.

12. The method of claim 1, wherein, after forming said final conductive gate electrode, the method comprises forming a gate cap above said final conductive gate electrode, said at least one non-sacrificial second spacer and said non-sacrificial innermost first spacer.

13. The method of claim 11, wherein, after forming said final conductive gate electrode, the method comprises:
 forming a gate cap above said final conductive gate electrode, said at least one non-sacrificial second spacer and said non-sacrificial innermost first spacer;
 removing said sacrificial plug material selectively relative to said gate cap; and
 forming a top source/drain contact that is conductively coupled to said top source/drain region, wherein said top source/drain contact physically contacts said gate cap.

14. A method of forming a gate structure on a vertical transistor device, the method comprising:
 forming a vertically oriented channel semiconductor structure;
 performing a plurality of conformal deposition/anisotropic etching process sequences to form an initial multi-layered sidewall spacer around an entire perimeter of said vertically oriented channel semiconductor structure, wherein said initial multi-layered sidewall spacer has an initial height and comprises a non-sacrificial innermost first spacer comprised of a high-k insulating material, a sacrificial outermost spacer and at least one non-sacrificial second spacer comprised of a metal-containing material positioned between said non-sacrificial innermost first spacer and said sacrificial outermost spacer;
 forming a layer of material adjacent said initial multi-layered sidewall spacer;
 after forming said layer of material, performing at least one recess etching process on said initial multi-layered sidewall spacer to thereby define a recessed multi-layered sidewall spacer having a recessed height that is less than said initial height of said initial multi-layered sidewall spacer;
 performing at least one etching process to remove an entirety of said sacrificial outermost spacer from said recessed multi-layered sidewall spacer while leaving said at least one non-sacrificial second spacer and said non-sacrificial innermost first spacer in position and thereby define a replacement gate electrode cavity that is at least partially defined by said layer of material and said at least one non-sacrificial second spacer; and
 forming a final conductive gate electrode in said replacement gate electrode cavity.

15. The method of claim 14, wherein said non-sacrificial innermost first spacer is formed on and in contact with a sidewall of said vertically oriented channel semiconductor structure and said at least one non-sacrificial second spacer is formed on and in contact with said non-sacrificial innermost first spacer.

16. The method of claim 15, wherein said sacrificial outermost spacer is formed on and in contact with said at least one non-sacrificial second spacer.

17. The method of claim 14, wherein said layer of material comprises silicon dioxide.

18. The method of claim 14, wherein performing said plurality of conformal deposition/anisotropic etching process sequences to form said initial multi-layered sidewall spacer comprises:
 performing a first conformal deposition process and a first anisotropic etching process to form said non-sacrificial innermost first spacer, wherein said non-sacrificial innermost first spacer is formed on and in contact with a sidewall of said vertically oriented channel semiconductor structure;
 after forming said non-sacrificial innermost first spacer, performing a second conformal deposition process and a second anisotropic etching process to form said at least one non-sacrificial second spacer, wherein said at least one non-sacrificial second spacer is formed on and in contact with said non-sacrificial innermost first spacer; and
 after forming said at least one non-sacrificial second spacer, performing a third conformal deposition process and a third anisotropic etching process to form said sacrificial outermost spacer, wherein said sacrificial outermost spacer is formed on and in contact with said at least one non-sacrificial second spacer.

19. The method of claim 14, wherein said replacement gate electrode cavity is further defined by a bottom spacer of said vertical transistor device.

20. The method of claim 14, wherein forming said final conductive gate electrode in said replacement gate electrode cavity comprises:
- depositing a conductive material so as to overfill said replacement gate electrode cavity;
- performing a planarization process so as to planarize an upper surface of said deposited conductive material; and
- after performing said planarization process, performing a recess etching process to remove a portion, but not all, of said deposited conductive material.

21. The method of claim 14, wherein, prior to performing said at least one etching process to remove said entirety of said sacrificial outermost spacer, the method comprises:
- forming a sacrificial spacer above an upper surface of said recessed multi-layered sidewall spacer while leaving at least a portion of an upper surface of said vertically oriented channel semiconductor structure exposed;
- performing an ion implantation process through an opening defined by said sacrificial spacer so as to form a top source/drain region in said vertically oriented channel semiconductor structure;
- after performing said ion implantation process, forming a sacrificial plug material in said opening defined by said sacrificial spacer and above said upper surface of said vertically oriented channel semiconductor structure; and
- removing said sacrificial spacer while leaving said sacrificial plug material in position so as to thereby expose said upper surface of said recessed multi-layered sidewall spacer.

22. The method of claim 14, wherein, after forming said final conductive gate electrode, the method comprises forming a gate cap above said final conductive gate electrode, said at least one non-sacrificial second spacer and said non-sacrificial innermost first spacer.

23. The method of claim 21, wherein, after forming said final conductive gate electrode, the method comprises:
- forming a gate cap above said final conductive gate electrode, said at least one non-sacrificial second spacer and said non-sacrificial innermost first spacer;
- removing said sacrificial plug material selectively relative to said gate cap; and
- forming a top source/drain contact that is conductively coupled to said top source/drain region, wherein said top source/drain contact physically contacts said gate cap.

24. A method of forming a gate structure on a vertical transistor device, the method comprising:
- forming a vertically oriented channel semiconductor structure;
- forming a multi-layered sidewall spacer around an entire perimeter of said vertically oriented channel semiconductor structure, wherein said multi-layered sidewall spacer comprises a non-sacrificial innermost first spacer comprised of a high-k insulating material, a sacrificial outermost spacer and at least one non-sacrificial second spacer comprised of a metal-containing material positioned between said non-sacrificial innermost first spacer and said sacrificial outermost spacer;
- performing at least one etching process to remove at least a portion of said sacrificial outermost spacer from said multi-layered sidewall spacer while leaving said at least one non-sacrificial second spacer and said non-sacrificial innermost first spacer in position; and
- forming a final conductive gate electrode in place of said removed at least a portion of said sacrificial outermost spacer.

25. The method of claim 24, wherein said non-sacrificial innermost first spacer is formed on and in contact with a sidewall of said vertically oriented channel semiconductor structure, said at least one non-sacrificial second spacer is formed on and in contact with said non-sacrificial innermost first spacer, and said sacrificial outermost spacer is formed on and in contact with said at least one non-sacrificial second spacer.

26. The method of claim 24, wherein forming said multi-layered sidewall spacer around said entire perimeter of said vertically oriented channel semiconductor structure comprises performing a plurality of conformal deposition/anisotropic etching process sequences to form said multi-layered sidewall spacer.

27. The method of claim 24, wherein, prior to performing said at least one etching process, the method further comprises performing at least one recess etching process to reduce an overall initial height of said multi-layered sidewall spacer.

28. The method of claim 24, wherein performing said at least one etching process to remove at least a portion of said sacrificial outermost spacer results in the definition of a replacement gate electrode cavity that is at least partially defined by a layer of insulating material and said at least one non-sacrificial second spacer and wherein forming said final conductive gate electrode comprises forming said final conductive gate electrode in said replacement gate electrode cavity.

29. The method of claim 24, wherein performing said at least one etching process to remove at least a portion of said sacrificial outermost spacer comprises performing said at least one etching process to remove an entirety of said sacrificial outermost spacer.

30. The method of claim 24, wherein, after forming said final conductive gate electrode, the method comprises forming a gate cap above said final conductive gate electrode, said at least one non-sacrificial second spacer and said non-sacrificial innermost first spacer.

* * * * *